United States Patent
Jaki

[11] 4,021,762
[45] May 3, 1977

[54] QUARTZ CRYSTAL COMPENSATION CIRCUIT

[75] Inventor: Ivan Jaki, Norsborg, Sweden

[73] Assignee: Telefonaktiebolaget L M Ericsson, Stockholm, Sweden

[22] Filed: Dec. 31, 1975

[21] Appl. No.: 645,560

[30] Foreign Application Priority Data

Jan. 23, 1975 Sweden .......................... 7500713

[52] U.S. Cl. .................................. 333/72; 310/8.2
[51] Int. Cl.² .................... H03H 9/00; H04R 17/10
[58] Field of Search ............... 333/72; 310/8.2, 8.1, 310/8; 331/158; 329/117

[56] References Cited
UNITED STATES PATENTS

| | | | |
|---|---|---|---|
| 2,313,182 | 3/1943 | Thompson | 333/72 |
| 2,613,320 | 10/1952 | Panetta | 333/72 X |
| 2,637,779 | 5/1953 | Craiglow | 333/72 |
| 2,805,400 | 9/1957 | Seddon | 333/72 |
| 3,179,906 | 4/1965 | Turvey | 333/72 |
| 3,613,032 | 10/1971 | Pond | 333/72 |

*Primary Examiner*—Alfred E. Smith
*Assistant Examiner*—Marvin Nussbaum
*Attorney, Agent, or Firm*—Hane, Sullivan & Spiecens

[57] ABSTRACT

A compensation circuit is provided for a piezo-electric quartz crystal in a filter circuit for reducing the influence of the secondary resonance frequencies of the crystal on the filter characteristic. The Q-value of the crystal at one or several secondary resonance frequencies is reduced by connecting to the crystal a two-terminal network the impedance of which has a real and an imaginary part so that the real part gives an ohmic contribution which at the resonance frequency of the imaginary part reduces the Q-value of the crystal.

5 Claims, 5 Drawing Figures

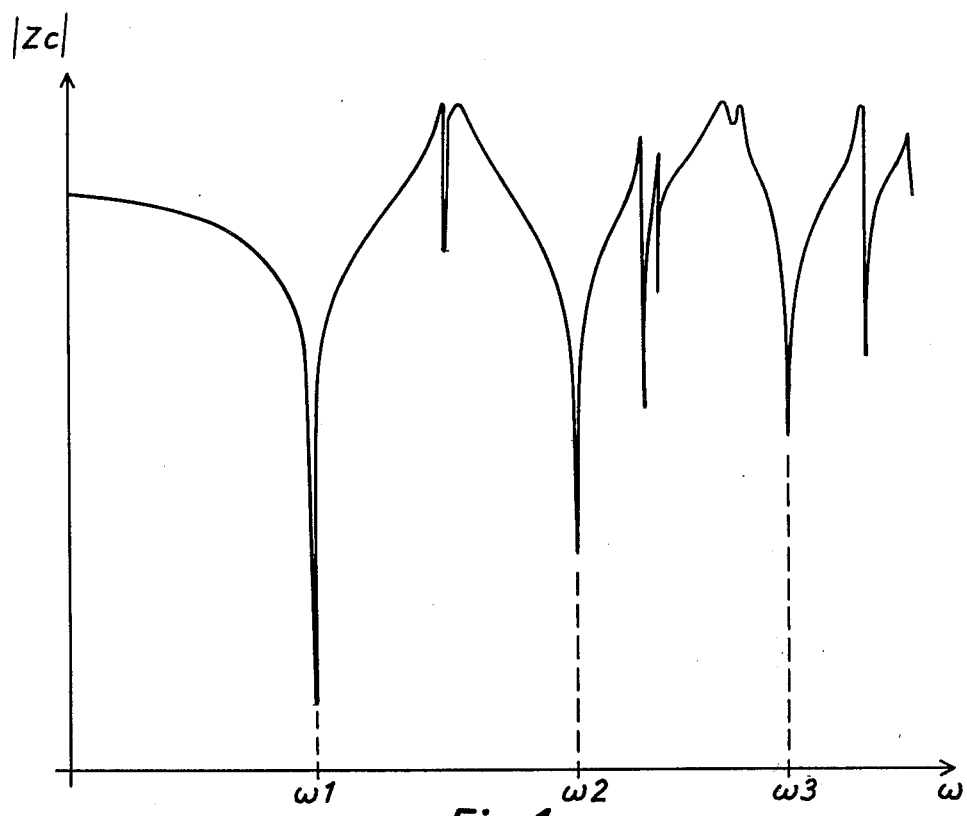
Fig.1
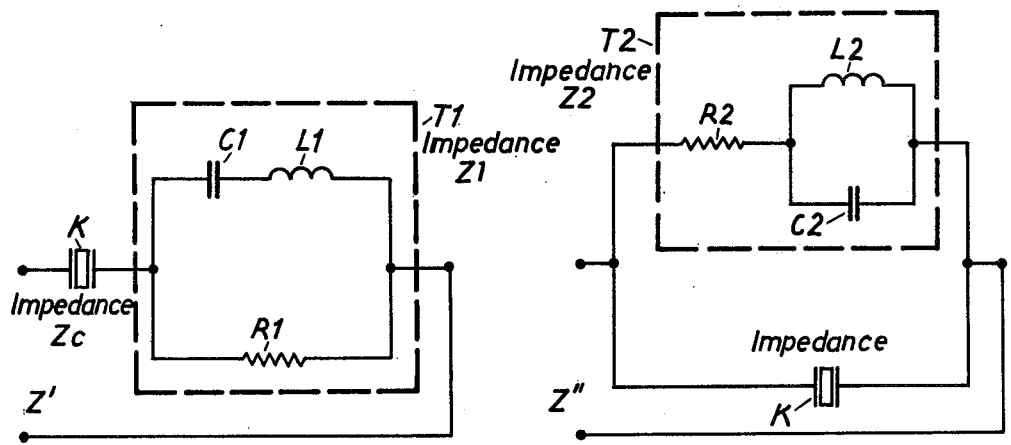
Fig.3                    Fig.4

QUARTZ CRYSTAL COMPENSATION CIRCUIT

The present invention relates to a compensation circuit for a quartz crystal which can oscillate at a number of resonance frequencies which are characteristic of the crystal. More precisely the invention relates to a compensation circuit in order to increase the impedance of a quartz crystal included, for example, in a band reject filter at certain frequencies which differ from the fundamental frequency of the crystal, such frequencies causing undesired stop and pass bands.

It is previously known to use piezo-electric crystals as frequency determining elements in electric circuits, for example, filter circuits. This is due to the fact that the crystal at its resonance frequencies shows a very high Q-value (in the order of $10^4 - 10^6$) so that the filter including the crystal can be made to show a very steep transfer from its stop band to its pass band range. One problem arising when the crystals are used as frequency determining elements is that the crystal, besides its main resonance frequency, shows so called secondary resonance frequencies i.e., the crystal oscillates at frequencies which are not desired when dimensioning the circuit in which the crystal is included. Also at these secondary frequencies the crystal shows a relatively high Q-value so that the filter will have undesired stop or pass bands intended for quite other frequencies than those for which the filter is dimensioned.

It is previously known, cf, for example, the U.S. Pat. No. 3,179,906 to provide resonant circuits before and after the filter in order to avoid the above mentioned, undesired stop bands of a crystal band reject filter, the resonant circuits being tuned to the secondary resonance frequencies of the crystal so that signals within their frequency bands are rejected. If, for example, a parallel resonant circuit having a resonance frequency which is equal to one of the secondary resonance frequencies of the crystal is connected to the crystal, the circuit so obtained, however, will show two resonance frequencies one of which usually differs from the main resonance frequency of the crystal. Thus, two undesired resonance peaks are obtained at the expense of having eliminated one of the secondary resonance peaks of the crystal.

An object of the present invention is to provide a compensation circuit for a quartz crystal preferably included in a filter by means of which it is possible to reduce the influence of at least one of the secondary resonances of the crystal.

The invention, the characteristics of which appear from the appended claims, will be described more in detail with reference to the accompanying drawings in which:

FIG. 1 shows a diagram of the absolute value of the impedance of a quartz crystal as a function of the frequency;

FIG. 3 shows an embodiment of the compensation circuit according to the present invention;

FIG. 4 shows another embodiment of the compensation circuit according to the present invention;

The diagram according to FIG. 1 illustrates the absolute value of the impedance Zc of a quartz crystal as a function of the frequency. The crystal shows a main resonance at the frequency $\omega 1$, i.e. a sharp minimum value for which the impedance Zc is purely ohmic and which assumes the values 10 – 200 ohms for a certain type of crystals. Similar minimum values appear at the frequencies $\omega 2$ and $\omega 3$, the so called secondary resonance frequencies of the crystal. Further secondary resonances appear at frequencies higher than $\omega 3$ (not shown in the Figure). When dimensioning, for example, a filter attention must be paid to the values of the secondary resonances as these give rise to undesired stop and pass bands.

Figure 2:
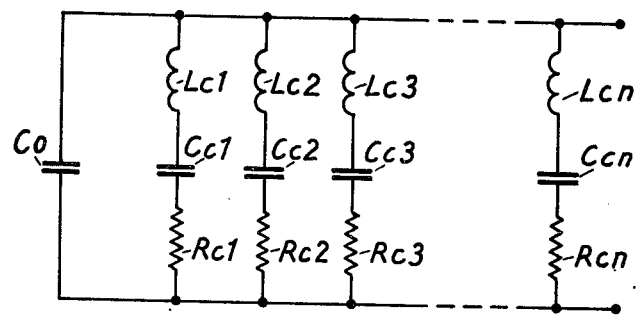
FIG. 2 shows the equivalent circuit diagram of a quartz crystal in order to illustrate the properties of the crystal more in detail.

FIG. 2 shows the equivalent circuit diagram of a quartz crystal. The diagram shows that the crystal can be represented by a parallel connection of series resonant circuits. One of such circuits has a resonance frequency which is equal to the main resonance frequency and the others have series resonance frequencies which are equal to the secondary resonance frequencies of the crystal. In addition, the crystal shows a capacitance Co. If the series resonant circuit Rc1, Cc1, Lc1 symbolizes the circuit for which the main resonance frequency constitutes the resonance frequency, then $$\omega 1 = 1/\sqrt{Lc1Cc1}, \quad \omega 2 = 1/\sqrt{Lc2Cc2}, \quad \omega 3 = 1/\sqrt{Lc3Cc3},$$

and so on and the resistance of the crystal is equal to Rc1 at the main resonance frequency, Rc2 at the secondary resonance frequency $\omega 2$, and so on.

The invention is based on the observation that the crystal shows a high Q-value not only at its main resonance frequency $\omega 1$ but also at its secondary resonance frequencies $\omega 2$, $\omega 3$ and so on. Due to its high Q-value at these frequencies a steep decrease of the crystal impedance Zc is obtained. In order to equalize an undesired minimum of the impedance Zc at one or several secondary resonance frequencies, the Q-value at this frequency should be reduced to a desired value. According to the idea of the invention such a reduction of the Q-value of the crystal is carried out by connecting to the crystal a compensation circuit in the form of a two-terminal network, the impedance of which has a real and an imaginary part. In this way an ohmic part is introduced which, outside the frequency equal to the resonance frequency of the imaginary part, has a reducing effect on the Q-value of the crystal.

FIG. 3 shows an embodiment of the compensation circuit according to the present invention. The compensation circuit consists of the two-terminal network T1 comprising the series resonant circuit L1, C1 which is connected in parallel with the resistor R1. The resonance frequency of the series resonant circuit L1, C1 is chosen to be equal to the main resonance frequency of the crystal. Thus the impedance of the two-terminal network is negligible at the main resonance frequency and the crystal is undisturbed at this frequency. For frequencies outside the main resonance frequency, the impedance of the two-terminal network receives a contribution from the reactance of the series resonant circuit L1, C1 and the ohmic part of the impedance of the two-terminal network will have a reducing effect on the Q-value of the crystal at frequencies outside the main resonance frequency. The impedance Z1 of the two-terminal network is then $$Z1 = \frac{A \cdot R1}{A^2 + \omega^2 C1^2 R1^2}(A - j\omega R1 C1),$$

where $A = (1 - \omega^2 L1.C1)$
The figure of merit Q of the crystal together with the two-terminal network T1 at, for example, the resonant frequency $\omega 2$ can be expressed as $$Q = \frac{\omega 2 Lc2 + Im/Z1(\omega 2)/}{Rc2 + Re/Z1(\omega 2)/}$$

Furthermore, the following is valid $$Re/Z1/ = \frac{A^2 \cdot R1}{B} \text{ and } Im/Z1/ = -\frac{\omega R1 C1}{B},$$

where $A = (1 - \omega^2 L1C1)$ and $B = A^2 + \omega^2 R1^2 C1^2$. The figure of merit of the crystal together with the two-terminal network T1 is then shown to be $$Q = \frac{\omega 2 Lc2 - \omega 2 R1 C1/B}{Rc2 + A^2 R1/B}.$$

In order to simplify this expression certain approximations may be made. As $\omega 2 > \omega 1 = 1/\sqrt{L1C1}$, then $\omega 2^2 L1C1 >> 1$, i.e., $A \approx -\omega 2^2 L1C1$ and $B \approx \omega 2^4 L1^2 C1^2 + \omega 2^{22} R1^2 C1^2$. The factor $\omega 2 Lc1$ is $>> 2R1C1/B$ as the factor B as well as the factor Lc2 are relatively high numbers. At the frequency $\omega 2$ it is valid that $\omega 2^2 R1 C1 >> (\omega 2^2 L1C1)^2$ and thus the factor $A^2/B \approx 1$. These approximations result in that $$Q(\omega 2) = \frac{Qc(\omega 2) \cdot Rc2}{Rc2 + R1}$$

A more accurate expression of the Q-value is, according to the calculations above $$Q(\omega 2) = \frac{\omega 2 Lc2}{Rc2 + A^2 R1/B},$$

since the factor $\omega 2 Lc2$ in most cases is greater than the factor $\omega 2 R1 C1/B$.

FIG. 4 shows another embodiment of the compensation circuit according to the invention. The crystal is designated K and its frequency depending impedance Zc varies according to the diagram according to FIG. 1. A two-terminal network T2 having the impedance Z2 is connected in parallel with the crystal K, such two-terminal network comprising of the resistor R2 and of the parallel resonant circuit L2, C2. Additional two-terminal networks of the same structure as the two-terminal network T2 can be connected in parallel with the crystal K. The inductance L2 and the capacitance C2 are dimensioned in such a way that the resonant circuit L2, C2 is resonant at the main resonance frequency of the crystal $\omega 1$, i.e. $\omega 1 = 1/\sqrt{L2C2}$. At this frequency the impedance of the parallel resonant circuit is high and the crystal is undisturbed. Thus the resistance of the resistor R2 has no influence on the crystal at the main resonance frequency. For the frequencies outside the frequency $\omega 1$, however, the reactance of the parallel resonant circuit will be lower than at the main resonance frequency and the resistance of the resistor R2 will have an influence on the crystal in such a way that its Q-value outside the frequency $\omega 1$ will be reduced.

The design of the compensation circuit according to the present invention is not limited to a single two-terminal network comprising a resonant circuit in series or in parallel with a resistor as shown in FIGS. 3 and 4. It is also possible, especially when dimensioning filter links, to combine both of the two-terminal networks in such a way that a compensation circuit formed by a series-parallel combination is obtained.

Figure 5:
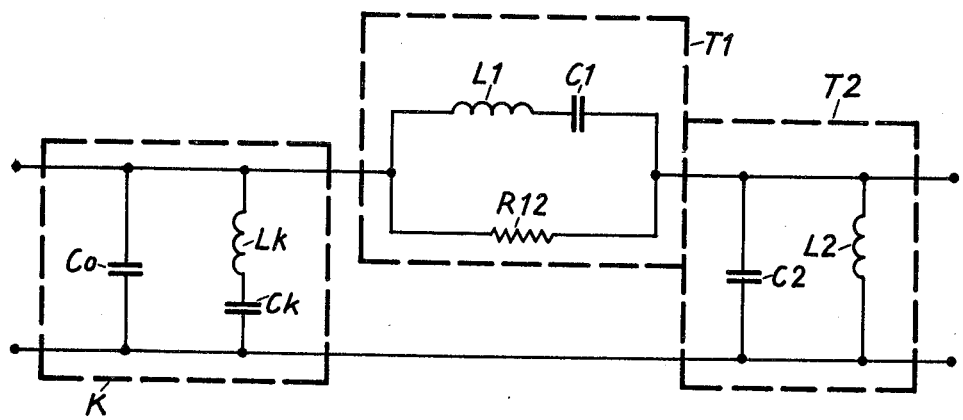
FIG. 5 shows a band reject filter link including a crystal having a compensation circuit according to the present invention.

FIG. 5 shows a practical embodiment of a band reject filter link in which a compensation circuit according to the invention is included in the form of such a series-parallel combination. The filter link is then dimensioned in such a way that it attenuates the frequency 60 kHz and gives an equalization of the crystal impedance at the secondary resonance frequency $3 \times 60 = 180$ kHz. A crystal of the type RTM 452 (Quarz Keramic Gmbh is included in the link and the crystal has been symbolized with the parallel connection of the capcitor Co and a series resonant circuit Lk, Ck, of the equivalent circuit diagram according to FIG. 2. A first two-terminal network T2 having a design according to FIG. 4 is connected in parallel with the crystal K. Furthermore, a second two-terminal network T1 having the same design as the circuit according to FIG. 3 is connected in series with the crystal. For practical reasons, the resistor R1 of FIG. 3 has been combined with the resistor R2 in the two-terminal network of FIG. 4, thus forming one resistor R12 in the circuit diagram of FIG. 5. The components included in the filter link have the following values Co = 34 pF, Lk = 25.000 mH, Ck = 0.28178 pF.

These values are obtained by measurements of the crystal at the secondary resonance frequency 180 kHz. A calculation gives the following remaining values for the link.

C1 = 788.9306 pF, C2 = 581. 504 pF
L1 = 12.3123 mH, L2 = 12.1 mH, R12 = 8 kohm.

The calculation of the Q-value of the crystal at the third and the fifth harmonic, i.e., at the frequencies 180 kHz and 300 kHz shows that the Q-value has been reduced by a factor 1000 at 180 kHz and by a factor 2000 at 300 kHz. Thus a considerable reduction of the Q-value of the crystal at the undesired harmonics has been obtained and consequently a considerable reduction of the influence by the secondary resonance frequencies in the filter link.

The above described embodiments of the compensation circuit have been dimensioned in such a way that a reduction of the Q-value of the crystal at the secondary resonance frequencies is obtained, while the Q-value at the fundamental frequency of the crystal remains unchanged. It is also possible, however, to dimension the compensation circuit in such a way that the Q-value of the crystal remains unchanged at some of the secondary resonance frequencies, while its Q-value is reduced at the fundamental frequency and at the remaining secondary resonance frequencies.

The ratio between the Q-value of the crystal and the Q-value obtained by means of the compensation circuit can vary within a wide range, from values somewhat above 1 up to several thousand depending on the frequency properties of the crystal and on the frequency range for which compensation is desired.

We claim:

1. A compensation network for a quartz crystal, said crystal having a plurality of resonance frequencies including a main resonance frequency and a plurality of secondary resonance frequencies, said network comprising a two-terminal network having a resistive and a reactive part, and means for connecting said two-terminal network to said crystal to provide a two-terminal frequency determining circuit having a pair of access terminals, said reactive and resistive parts being dimensioned so that: (1) the reactive part of said two-terminal network is a resonant circuit having a resonance frequency equal to one of said plurality of resonance frequencies; (2) the impedance of the two-terminal frequency determining network is different from the impedance of said crystal at frequencies other than said one resonance frequency; and (3) the Q-value of the two-terminal frequency determining network at another of the resonance frequencies of said plurality is at least 1.2 times smaller than the Q-values of said crystal at said one resonance frequency.

2. A compensation as claimed in claim 1 wherein said one resonance frequency is the main resonance frequency of the crystal, and the other resonance frequencies being the secondary resonance frequencies of the crystal.

3. A compensation circuit as claimed in claim 2 wherein said one resonance frequency is one of the secondary resonance frequencies of the crystal, and the other frequencies differing from said one resonance frequency being the main resonance frequency and the other secondary resonance frequencies of the crystal.

4. A compensation circuit as claimed in claim 1 wherein the two-terminal network is a parallel circuit connected in series with the crystal, and said parallel circuit comprises a series resonant branch and a resistive branch.

5. A compensation circuit as claimed in claim 1 wherein the two-terminal network is connected in parallel with said crystal and comprises a parallel resonant circuit connected in series with a resistor.

* * * * *